United States Patent
Kao et al.

(10) Patent No.: US 11,404,534 B2
(45) Date of Patent: Aug. 2, 2022

(54) BACKSIDE CAPACITOR TECHNIQUES

(71) Applicant: Taiwan Semiconductor Manufacturing Co., Ltd., Hsin-Chu (TW)

(72) Inventors: Min-Feng Kao, Chiayi (TW);
Dun-Nian Yaung, Taipei (TW);
Hsing-Chih Lin, Tainan (TW);
Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 88 days.

(21) Appl. No.: 16/853,927

(22) Filed: Apr. 21, 2020

(65) Prior Publication Data

US 2020/0411636 A1    Dec. 31, 2020

Related U.S. Application Data

(60) Provisional application No. 62/868,289, filed on Jun. 28, 2019.

(51) Int. Cl.
*H01L 49/02* (2006.01)
*H01L 23/48* (2006.01)
(Continued)

(52) U.S. Cl.
CPC ...... *H01L 28/91* (2013.01); *H01L 21/823475* (2013.01); *H01L 23/481* (2013.01); *H01L 23/528* (2013.01); *H01L 23/5223* (2013.01); *H01L 24/08* (2013.01); *H01L 24/89* (2013.01); *H01L 25/0657* (2013.01); *H01L 25/50* (2013.01); *H01L 27/0629* (2013.01);
(Continued)

(58) Field of Classification Search
None
See application file for complete search history.

(56) References Cited

U.S. PATENT DOCUMENTS 8,693,163 B2 * 4/2014 Su ............... H01L 21/76898
361/278
9,023,688 B1 * 5/2015 Or-Bach ............ H01L 23/3677
438/122

(Continued)

FOREIGN PATENT DOCUMENTS

CN    100413055 C  *  8/2008 ............. H01L 28/84
CN    102386240 B  *  12/2013 ............. H01L 28/92
(Continued)

*Primary Examiner* — Telly D Green
(74) *Attorney, Agent, or Firm* — Eschweiler & Potashnik, LLC

(57) ABSTRACT

Some embodiments relate to a semiconductor structure including a semiconductor substrate having a frontside surface and a backside surface. An interconnect structure is disposed over the frontside surface. The interconnect structure includes a plurality of metal lines and vias that operably couple semiconductor transistor devices disposed in or on the frontside surface of the semiconductor substrate to one another. A trench is disposed in the backside surface of the semiconductor substrate. The trench is filled with an inner capacitor electrode, a capacitor dielectric layer overlying the inner capacitor electrode, and an outer capacitor electrode overlying the capacitor dielectric layer.

20 Claims, 8 Drawing Sheets

(51) Int. Cl.
*H01L 21/8234* (2006.01)
*H01L 25/00* (2006.01)
*H01L 25/065* (2006.01)
*H01L 27/06* (2006.01)
*H01L 23/522* (2006.01)
*H01L 23/00* (2006.01)
*H01L 23/528* (2006.01)

(52) U.S. Cl.
CPC ............... *H01L 2224/08145* (2013.01); *H01L 2224/80895* (2013.01); *H01L 2224/80896* (2013.01); *H01L 2225/06541* (2013.01); *H01L 2225/06565* (2013.01)

(56) References Cited

U.S. PATENT DOCUMENTS

| | | | |
|---|---|---|---|
| 9,331,062 B1 * | 5/2016 | Lane | H01L 23/5286 |
| 9,608,130 B2 * | 3/2017 | Tran | H01L 29/66083 |
| 10,157,867 B1 | 12/2018 | Chen et al. | |
| 10,164,005 B2 * | 12/2018 | Tsui | H01L 28/00 |
| 10,269,894 B1 * | 4/2019 | Tsui | H01L 28/90 |
| 2007/0278619 A1 * | 12/2007 | Clevenger | H01L 21/76898 |
| | | | 257/532 |
| 2013/0092993 A1 | 4/2013 | Hijioka et al. | |
| 2014/0145299 A1 * | 5/2014 | Kalnitsky | H01L 28/91 |
| | | | 257/532 |
| 2014/0159197 A1 | 6/2014 | Weng et al. | |
| 2016/0020267 A1 * | 1/2016 | Lin | H01L 29/945 |
| | | | 257/532 |
| 2017/0186643 A1 * | 6/2017 | Stamper | H01L 21/76256 |
| 2017/0186837 A1 | 6/2017 | Yen et al. | |
| 2017/0271436 A1 * | 9/2017 | Tsui | H01L 28/00 |
| 2017/0359893 A1 * | 12/2017 | Goh | H05K 1/141 |
| 2019/0148481 A1 * | 5/2019 | Tsui | H01L 28/90 |
| | | | 257/532 |
| 2019/0393153 A1 * | 12/2019 | Wang | H01L 23/5283 |
| 2020/0098849 A1 * | 3/2020 | Naser | H01L 23/5226 |
| 2020/0212229 A1 * | 7/2020 | Hu | H01L 29/1083 |
| 2021/0369123 A1 * | 12/2021 | Cros | A61B 5/0215 |

FOREIGN PATENT DOCUMENTS

| | | | | |
|---|---|---|---|---|
| CN | 103681597 A | * | 3/2014 | ....... H01L 23/53238 |
| CN | 102257622 B | * | 6/2014 | ......... H01L 27/0805 |
| EP | 3043381 A1 | * | 7/2016 | ......... H01L 27/0805 |
| JP | 2015032663 A | * | 2/2015 | ......... H01L 27/1464 |
| KR | 20120022519 A | * | 3/2012 | ............. H01L 28/40 |
| KR | 101194945 B1 | * | 10/2012 | ............. H01L 28/40 |
| WO | WO-2004114397 A1 | * | 12/2004 | ....... H01L 21/76898 |
| WO | WO-2007054858 A2 | * | 5/2007 | ............. H01L 28/91 |
| WO | WO-2007132423 A2 | * | 11/2007 | ......... H01L 23/5223 |
| WO | WO-2018219101 A1 | * | 12/2018 | ............. H01L 28/75 |
| WO | WO-2019132925 A1 | * | 7/2019 | ........... H03H 9/0542 |
| WO | WO-2019132926 A1 | * | 7/2019 | ........... H03H 9/1071 |

* cited by examiner

BACKSIDE CAPACITOR TECHNIQUES

REFERENCE TO RELATED APPLICATION

This application claims the benefit of U.S. Provisional Application No. 62/868,289, filed on Jun. 28, 2019, the contents of which are hereby incorporated by reference in their entirety.

BACKGROUND

Mobile phones and other mobile devices often rely upon ceramic capacitors and other passive devices discretely mounted to printed circuit boards (PCBs) of the mobile devices and electrically coupled to integrated circuits (ICs) of the mobile devices by the PCBs. However, this uses large amounts of surface area on the PCBs and hence limits mobile device size and/or mobile device functionality. Further, discretely mounting and electrically coupling the passive devices increases manufacturing costs. Accordingly, mobile devices are increasingly turning to integrated passive devices (IPDs) to reduce size, reduce cost, and increase functionality. An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
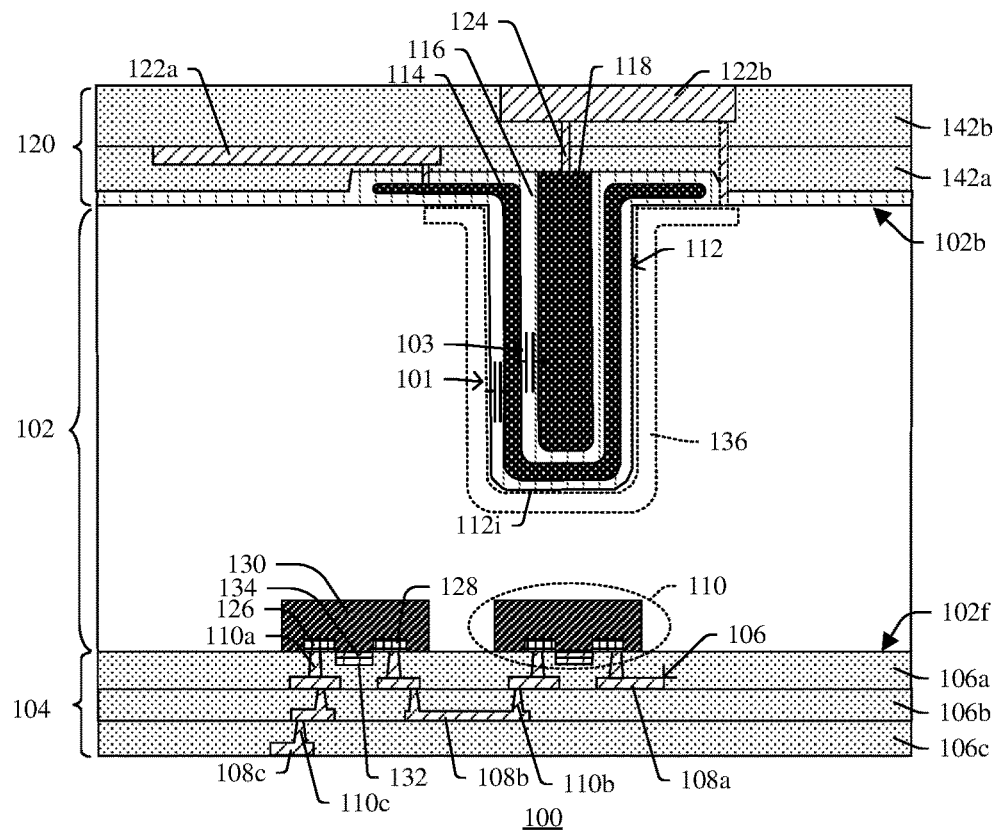
FIG. 1 illustrates a cross-sectional view of some embodiments of a semiconductor structure comprising a backside trench capacitor with a high capacitance density.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Metal-insulator-metal (MIM) or metal-oxide-metal (MOM) capacitors are commonly embedded in integrated circuits (ICs) and are used in place of ceramic capacitors to reduce the size of mobile devices, reduce the cost of mobile devices, increase the functionality of mobile devices, or any combination of the foregoing. In some instances, an MIM or MOM capacitor is arranged in an interconnect structure overlying a frontside of a semiconductor substrate. For example, the interconnect structure can be made up of a number of horizontal metal lines (e.g., wires) stacked over one another and interconnected by vertical vias, wherein the interconnect structure operably couples semiconductor devices (e.g., transistors) on the frontside of the semiconductor substrate to one another to implement a prefined circuit configuration. The MIM/MOM capacitor can have its electrodes formed in the interconnect structure over the frontside of the substrate, such that the MIM/MOM capacitor is easily integrated with the rest of the IC. However, for large capacitance values, a large area on the IC is generally needed for such MIM/MOM capacitors. This adds cost to the IC, and is thus in some regards less than an optimal solution.

Various embodiments of the present application are directed towards a capacitor that is formed on a backside of a semiconductor substrate. Thus, semiconductor devices such as transistors are formed on a frontside of the semiconductor substrate, and an interconnect structure is formed over the frontside of the substrate to operably couple the semiconductor devices to one another. A trench is formed in the backside of the substrate, and is alternatingly lined with conductive layers and dielectric layers stacked over one another to establish a capacitor in the trench in the backside of the substrate. By forming the capacitor in the trench in the backside of the substrate, the impact of the capacitor on the overall area of the IC is limited compared to traditional MIM/MOM capacitors. Further, a number of these substrates, each including one or more backside capacitors can be stacked over one another in some cases to form a three-dimensional IC that provides relatively high capacitance values in a relatively small footprint.

With reference to FIG. 1, a cross-sectional view of some embodiments of a semiconductor structure 100 comprising a backside trench capacitor is provided.

The semiconductor structure 100 includes a semiconductor substrate 102 having a frontside surface 102$f$ and a backside surface 102$b$. Semiconductor devices 110, such as transistors, are disposed on the frontside surface 102$f$. The illustrated semiconductor device 110 manifests as a transistor that includes first and second source/drain regions 126, 128 that are doped with a first doping conductivity (e.g., n-type). A body region, which is illustrated as corresponding to a well region 130 in FIG. 1, is doped with a second doping conductivity (e.g., p-type), and separates the first and second source/drain regions 126, 128 from one another. The second doping type is opposite the first doping type. A gate electrode 132 is disposed over the body region, and is separated from the body region by a gate dielectric 134. Other semiconductor devices, including active devices such as bipolar junction transistors (BJTs) or finFETS for example and/or passive devices such as resistors or diodes for example, could be present on the frontside surface 102f.

A frontside interconnect structure 104 is disposed over the frontside surface 102f. The frontside interconnect structure 104 includes a plurality of frontside metal lines and frontside vias that operably couple the semiconductor devices 110 to one another.

The frontside interconnect structure 104 comprises a plurality of conductive layers embedded in dielectric material layers. The dielectric material layers comprise a plurality of interlayer dielectric (ILD) layers 106a, 106b, 106c, that each may comprise a suitable dielectric material. For example, in the present embodiments, the plurality of ILD layers 106a, 106b, 106c may comprise a low dielectric constant (low-k) material, the material having a constant lower than that of thermal silicon oxide. In other embodiments, the ILD layers 106a, 106b, 106c comprise silicon dioxide or another dielectric material. The dielectric material may be formed by CVD, HDPCVD, PECVD, combinations thereof, or other suitable processes. For the purposes of illustration, only three frontside ILD layers are shown in FIG. 1, it being understood that any number of frontside ILD layers may be implemented and that the frontside ILD layers as illustrated are merely exemplary.

The plurality of conductive layers in the frontside interconnect structure 104 provide interconnections between the various semiconductor devices 110. The plurality of conductive layers comprise metal lines including metal one lines 108a, metal two lines 108b, and so on to the top-most metal line 108c. The plurality of conductive layers further comprise contacts 110a to couple the metal one lines 108a to the semiconductor devices 110, and vias 110b, 110c to couple adjacent metal lines (e.g., 108b and 108c). The conductive layers of the frontside interconnect structure 104 may comprise conductive materials such as aluminum, aluminum/silicon/copper alloy, titanium, titanium nitride, tungsten, polysilicon, metal silicide, or combinations thereof, formed by a process including PVD, CVD, combinations thereof, or other suitable processes. Other manufacturing techniques to form the frontside interconnect structure 104 may comprise photolithography processing and etching to pattern the conductive materials for vertical connection (for example, vias/contacts) and horizontal connection (for example, metal layers). Alternatively, a copper multilayer interconnect may be used to form the metal patterns. The copper interconnect structure may comprise copper, copper alloy, titanium, titanium nitride, tantalum, tantalum nitride, tungsten, polysilicon, metal silicide, or combinations thereof. The copper interconnect may be formed by damascene technique including dielectric deposition, etching, deposition and planarization. The deposition may comprise sputtering, electroplating, CVD or other suitable processes.

A trench 112 is disposed in the backside surface 102b of the semiconductor substrate 102. The trench 112 is filled with a bottom capacitor electrode 114, a capacitor dielectric layer 116 overlying the bottom capacitor electrode 114, and an upper capacitor electrode 118 overlying the capacitor dielectric layer 116. The capacitor dielectric layer 116 separates the bottom capacitor electrode 114 and upper capacitor electrode 118 from one another, thereby establishing one or more capacitor elements in the region of the semiconductor substrate nearest the backside surface 102b.

In the embodiment of FIG. 1, an innermost surface 112i of the trench 112 is spaced apart from and directly below a bottom extent of the well region 130 of the semiconductor device 110 in the semiconductor substrate. In some embodiments, a doped region 136 lines the innermost surface of the trench 112, trench sidewalls, and optionally the backside of the semiconductor substrate, and can act as another capacitor electrode. Thus, in FIG. 1, a first capacitor element 101 can include the doped region 136 and the bottom capacitor electrode 114 spaced apart by an inner portion of capacitor dielectric layer 116, and a second capacitor element 103 can include the bottom capacitor electrode 114 and the upper capacitor electrode 118 spaced apart by an outer portion of the capacitor dielectric layer 116. In some embodiments, the first capacitor element 101 can be arranged in parallel with the second capacitor element 103 to realize further increases in capacitance per unit area.

A backside interconnect structure 120 includes a plurality of backside metal lines and backside contacts/vias that operably couple the bottom capacitor electrode 114 and upper capacitor electrode 118 to semiconductor devices 110 and/or to other backside trench capacitors. In some embodiments, the backside metal lines are thicker than the frontside metal lines, however in other embodiments the backside metal lines are the same thickness as the frontside metal lines. This configuration provides a relatively high density capacitance in a relatively small area of the IC.

The backside interconnect structure 120 comprises a plurality of backside conductive layers embedded in backside dielectric material layers. The dielectric material layers comprise a plurality of backside ILD layers 142a, 142b, that each may comprise a suitable dielectric material. For example, in the present embodiments, the plurality of backside ILD layers 142a, 142b may comprise a low dielectric constant (low-k) material, the material having a constant lower than that of thermal silicon oxide. In other embodiments, the backside ILD layers 142a, 142b comprises silicon dioxide or another dielectric material. The dielectric material may be formed by CVD, HDPCVD, PECVD, combinations thereof, or other suitable processes. For the purposes of illustration, only two backside ILD layers are shown in the backside interconnect structure 120 of FIG. 1, it being understood that any number of backside ILD layers may be implemented and that the backside ILD layers as illustrated are merely exemplary.

The plurality of conductive layers in the backside interconnect structure 120 provide interconnections between the various capacitor electrodes. The plurality of conductive layers comprise metal lines including metal one lines 122a and a top-most metal line 122b. The plurality of conductive layers further comprise contacts 124 to couple the metal lines to the capacitor electrodes. The conductive layers of the backside interconnect structure 120 may comprise conductive materials such as aluminum, aluminum/silicon/copper alloy, titanium, titanium nitride, tungsten, polysilicon, metal silicide, or combinations thereof, formed by a process including PVD, CVD, combinations thereof, or other suitable. Other manufacturing techniques to form the backside interconnect structure 120 may comprise photolithography processing and etching to pattern the conductive materials for vertical connection (for example, vias/contacts) and horizontal connection (for example, metal layers). Alternatively, a copper multilayer interconnect may be used to form the metal patterns. The copper interconnect structure may comprise copper, copper alloy, titanium, titanium nitride, tantalum, tantalum nitride, tungsten, polysilicon, metal silicide, or combinations thereof. The copper interconnect may be formed by damascene technique including dielectric deposition, etching, deposition and planarization. The deposition may comprise sputtering, electroplating, CVD or other suitable processes.

Figure 2:
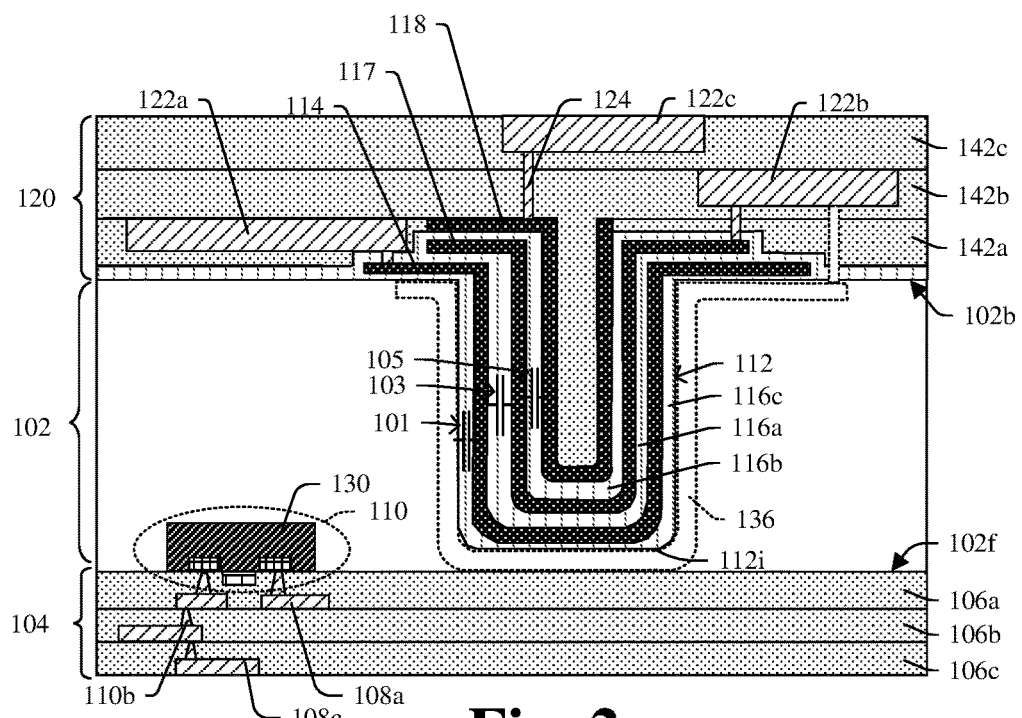
FIG. 2 illustrates a cross-sectional view of some embodiments of a semiconductor structure comprising a backside trench capacitor with a high capacitance density.

FIG. 2 illustrates another embodiment, wherein the innermost surface 112i of the trench 112 is laterally offset from and has a vertical overlap with the well region 130 of the semiconductor device 110 in the semiconductor substrate. Further, FIG. 2 illustrates an example where the backside trench capacitor includes a bottom capacitor electrode 114 and an intermediate capacitor electrode 117, which are separated from one another by a lower portion of the capacitor dielectric 116a; and an upper capacitor electrode 118 which is separated from the intermediate capacitor electrode 117 by an upper portion of the capacitor dielectric layer 116b. In some embodiments, a doped region 136 lines the innermost surface of the trench 112, trench sidewalls, and optionally the backside of the semiconductor substrate, and can act as another capacitor electrode. Thus, in FIG. 2, a first capacitor element 101 can include the doped region 136 and the bottom capacitor electrode 114, which are spaced apart by a bottom portion of the capacitor dielectric layer 116c. A second capacitor element 103 can include the bottom capacitor electrode 114 and the intermediate capacitor electrode 117, which are spaced apart by the lower portion of the capacitor dielectric layer 116a. A third capacitor element 105 can include the intermediate capacitor electrode 117 and the upper capacitor electrode 118, which are spaced apart by the upper portion of the capacitor dielectric layer 116b. In some embodiments, the first capacitor element 101 can be arranged in parallel with the second capacitor element 103 and/or the third capacitor element 105 to realize further increases in capacitance per unit area. Whereas the upper capacitor electrode 118 of FIG. 1 was a solid body, the upper capacitor electrode 118 of FIG. 2 is U-shaped in cross-section. In the example of FIG. 2, the bottom capacitor electrode 114 and/or intermediate capacitor electrode 117 have upper surfaces that are below an upper surface of the metal one line 122a, and the upper surface of the upper capacitor electrode 118 can be level or planar with the upper surface of the metal one line 122a in some embodiments.

It will be appreciated that although FIG. 1 and FIG. 2 are illustrated as examples, these illustrated embodiments are non-limiting. For example, though FIG. 1 shows two conductive layers disposed over an innermost surface of the trench, and FIG. 2 shows three conductive layers disposed over an innermost surface of the trench, any number of conductive layers could be present. Generally, adding additional conductive layers will tend to further increase the capacitance when the corresponding capacitor electrodes are coupled in parallel. However, these additional layers also add to processing time and complexity, so having fewer conductive layers as in FIG. 1 provides a stream-lined approach.

Figure 3:
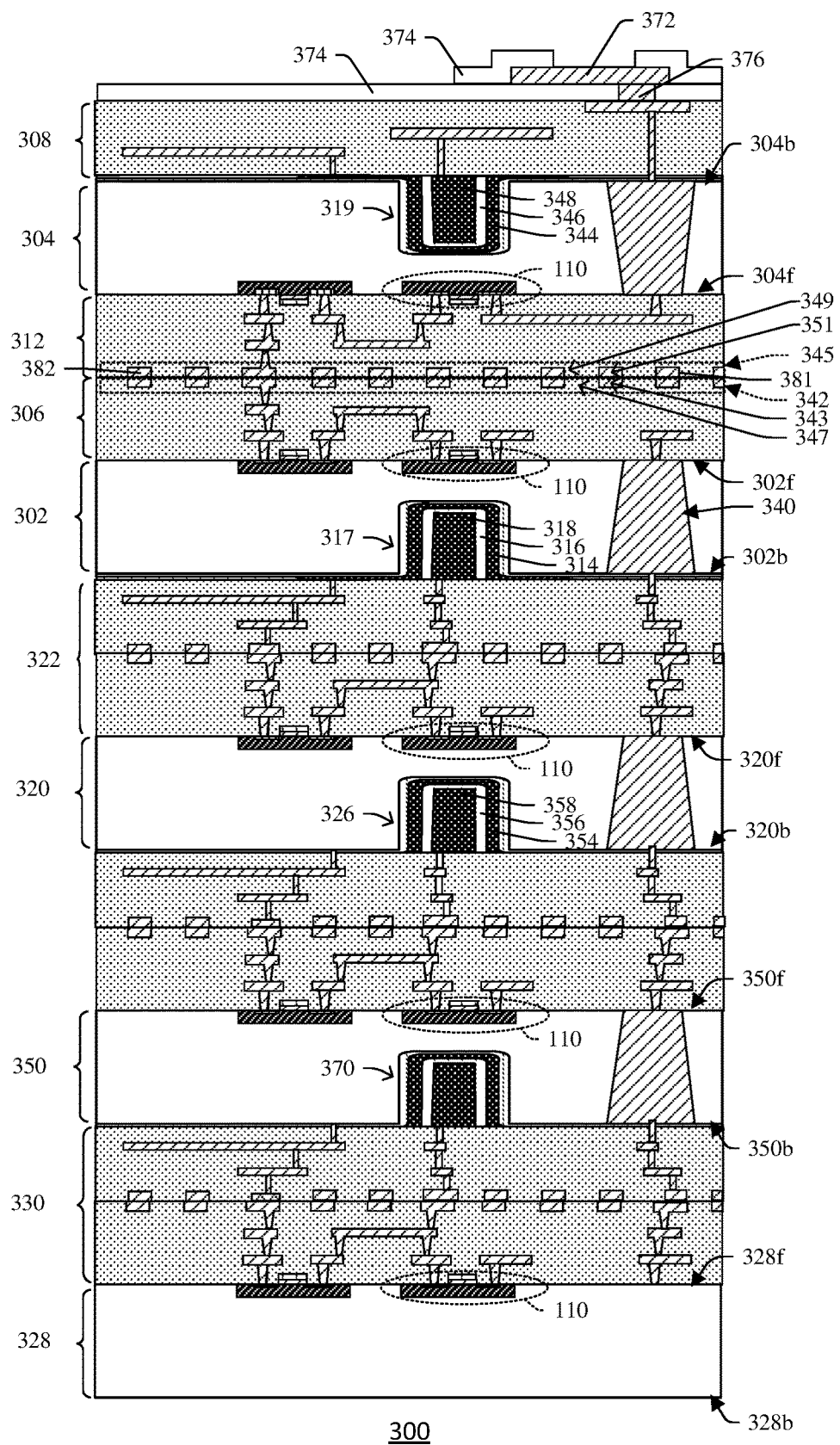
FIG. 3 illustrates a cross-sectional view of some embodiments of a three-dimensional IC that includes backside trench capacitors.

With reference to FIG. 3, a cross-sectional view of some embodiments of a semiconductor structure 300 is provided. The semiconductor structure 300 includes a number of substrates stacked over one another, with one or more of the substrates including at least one backside trench capacitor.

The semiconductor structure 300 includes a first semiconductor substrate 302 having a first frontside surface 302f and a first backside surface 302b. A second semiconductor substrate 304 has a second frontside surface 304f and a second backside surface 304b. The second semiconductor substrate 304 is disposed over the first semiconductor substrate 302. A first interconnect structure 306 is disposed between the first frontside surface 302f of the first semiconductor substrate 302 and the second frontside surface 304f of the second semiconductor substrate 304. The first interconnect structure 306 includes a first plurality of metal lines and vias that operably couple first semiconductor devices disposed in or on the first frontside surface 302f of the first semiconductor substrate 302 to one another. A second interconnect structure 312 is disposed between the first interconnect structure 306 and the second frontside surface 304f of the second semiconductor substrate 304. The second interconnect structure 312 includes a second plurality of metal lines and vias that operably couple second semiconductor devices disposed in or on the second frontside surface 304f of the second semiconductor substrate 304 to one another. A first trench 317 is disposed in the first backside surface 302b of the first semiconductor substrate 302. The first trench 317 is filled with a first inner capacitor electrode 314, a first capacitor dielectric layer 316 overlying the first inner capacitor electrode 314, and a first outer capacitor electrode 318 overlying the first capacitor dielectric layer 316. Thus, for example, the capacitor in FIG. 1 and/or FIG. 2 can be inset into the first trench 317 of FIG. 3 in some embodiments. A second trench 319 is disposed in the second backside surface of the second semiconductor substrate 304. The second trench 319 is filled with a second inner capacitor electrode 344, a second capacitor dielectric layer 346 overlying the second inner capacitor electrode, and a second outer capacitor electrode 348 overlying the second capacitor dielectric layer. Thus, for example, the capacitor in FIG. 1 and/or FIG. 2 can be inset into the second trench 319 of FIG. 3 in some embodiments.

The semiconductor structure 300 further includes a third semiconductor substrate 320 having a third frontside surface 320f and a third backside surface 320b. The third semiconductor substrate 320 is disposed beneath the first semiconductor substrate 302. A third interconnect structure 322 is disposed between the first backside surface 302b of the first semiconductor substrate and the third frontside surface 320f of the third semiconductor substrate. The third interconnect structure 322 includes a third plurality of metal lines and vias that operably couple third semiconductor devices disposed in or on the third frontside surface of the third semiconductor substrate to one another. A third trench 326 is disposed in the third backside surface of the third semiconductor substrate. The third trench 326 is filled with a third inner capacitor electrode 354, a third capacitor dielectric layer 356 overlying the third inner capacitor electrode, and a third outer capacitor electrode 358 overlying the third capacitor dielectric layer. Thus, for example, the capacitor in FIG. 1 and/or FIG. 2 can be inset into the third trench 326 of FIG. 3 in some embodiments.

The semiconductor structure 300 further includes: a fourth semiconductor substrate 328 having a fourth frontside surface 328f and a fourth backside surface 328b. The fourth semiconductor substrate 328 is disposed beneath the third semiconductor substrate 320. A fourth interconnect structure 330 is disposed between the third backside surface of the third semiconductor substrate 320 and the fourth frontside surface of the fourth semiconductor substrate 328. The fourth interconnect structure 330 includes a fourth plurality of metal lines and vias that operably couple fourth semiconductor devices disposed in or on the fourth frontside surface of the fourth semiconductor substrate 328 to one another. The fourth semiconductor substrate 328 has a fourth thickness that is greater than a first thickness of the first semiconductor substrate 302. Additional substrates (e.g. 350) can also be present in some instances, and can also include additional backside trench capacitors (e.g., 370).

A bond pad or landing pad 372, which comprises a metal such as copper or aluminum for example, is disposed over a passivation layer 374, and is coupled to a second backside interconnect structure 308 via a redistribution layer (RDL) via 376. The bonding pad or landing pad 372 can be operably coupled to one or more capacitors or semiconductor devices on the 3DIC through the RDL via 376 and second backside interconnect structure 308. The passivation layer 374 can comprise a resin, an epoxy, a plastic, or a ceramic material for example.

In some embodiments, each of the first, second, and third semiconductor substrates have a first thickness that is equal for each of the first, second, and third semiconductor substrates, and the fourth semiconductor substrate 328 has a fourth thickness that is greater than the first thickness.

The semiconductor structure 300 further includes through substrate vias (TSV) extending through the various substrates. For example, the first semiconductor substrate 302 includes a TSV 340 to couple the first interconnect structure 306 to the third interconnect structure 322. The through substrate vias have outer sidewalls which are spaced apart by a first distance on the first frontside and which are spaced apart by a second distance on the first backside, the first distance being less than the second distance. The other semiconductor substrates can also include through substrate vias, with through substrate vias being absent from the lowermost substrate (e.g., fourth semiconductor substrate 328) in some embodiments.

The semiconductor structure 300 further includes various bonding structures to bond the various substrates and interconnect structures to one another. For example, a first frontside bonding structure 342 disposed on the first frontside of the first semiconductor substrate 302 is bonded to a second frontside bonding structure 345 disposed over the second semiconductor substrate 304. The first frontside bonding structure 342 corresponds to the second frontside bonding structure 345 and is bonded to the second frontside bonding structure 345 through a hybrid bond. In some embodiments, the first frontside bonding structure 342 includes conductive features (e.g., metal features 343) disposed in a field of a dielectric layer 347, and the second frontside bonding structure 345 includes conductive features (e.g., metal features 351) disposed in a field of a dielectric layer 349. Further, some features 381 of the first frontside bonding structure 342 may be electrically coupled to semiconductor devices and/or capacitors on the first semiconductor substrate 302, while other features are "dummy" structures 382 that aid in bonding but which are electrically floating or disconnected from semiconductor devices and capacitors on the substrates.

The semiconductor substrate(s) 302, 304, 320, 328, and/or 350 may be or comprise, for example, a bulk semiconductor substrate, a SOI substrate, or some other semiconductor substrate. Further, the semiconductor substrate(s) may be or comprise, for example, monocrystalline silicon, some other silicon, or some other semiconductor material.

The capacitor dielectric layers 316, 346 are made of or comprise silicon dioxide, a high κ dielectric material, or a low-K dielectric material in some embodiments. Use of a high κ dielectric material is advantageous in that it increases the capacitance of the capacitor for a given area compared to silicon dioxide or a low-K dielectric material. The metal interconnect lines and/or vias typically are made of or comprise a metal, such as aluminum and/or copper for example.

In some embodiments, the semiconductor structure 300 of FIG. 3 is formed by forming semiconductor transistor devices, a frontside interconnect structure, a backside capacitor structure, and a backside interconnect structure for the first semiconductor substrate (optionally, the semiconductor substrate can be thinned, for example, by using a grinding step prior to formation of the trench in the backside of the substrate, in which case the backside capacitor may more closely resemble that of FIG. 2 than that of FIG. 1). Semiconductor transistor devices, a frontside interconnect structure, a backside capacitor structure, and a backside interconnect structure can also be formed for the other semiconductor substrates. The frontside interconnect structure of one substrate can then be bonded, for example by using a hybrid bond, to either a frontside interconnect structure or backside interconnect structure of another substrate. The substrates can be stacked in this manner to form the structure of FIG. 3.

FIGS. 4-12 illustrate a series of cross-sectional views that collectively illustrate some embodiments of manufacturing a semiconductor structure in accordance with some embodiments of the present disclosure.

Figure 4:
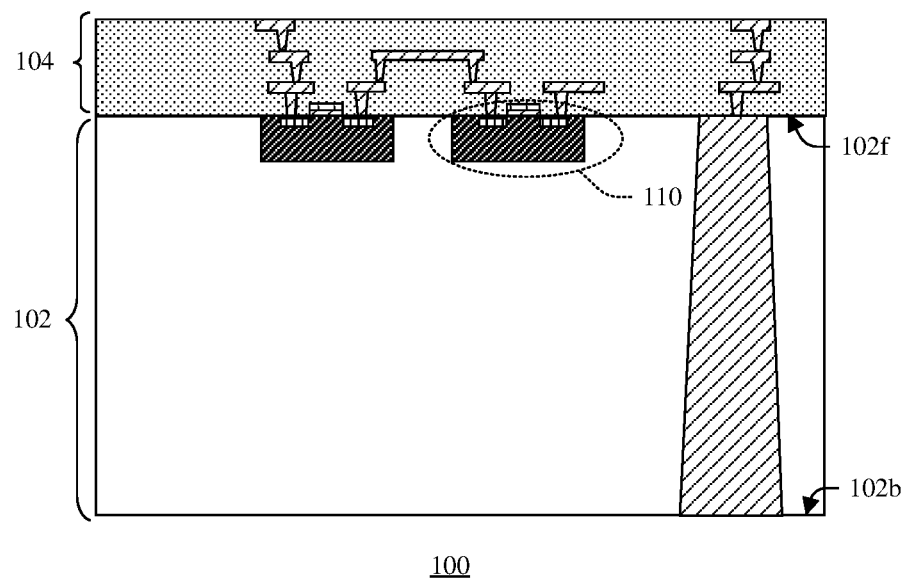
FIGS. 4-11 illustrate a series of cross-sectional views that collectively illustrate some embodiments of manufacturing a semiconductor structure in accordance with some embodiments of the present disclosure.

In FIG. 4, a first semiconductor substrate 102 is provided, and a plurality of semiconductor devices 110, such as transistors are formed on a first frontside 102f of the first semiconductor substrate 102. In some embodiments, the first semiconductor substrate 102 can comprise a monocrystalline silicon wafer, a semiconductor on insulator (SOI) wafer, or another semiconductor substrate. A first frontside interconnect structure 104 is formed over the first frontside of the first substrate, and a through-substrate-via (TSV) 186 is also formed. In some embodiments, the TSV 186 can be formed before the semiconductor devices 110, but in other embodiments, the TSV 186 can be formed after the semiconductor devices 110. Often, the TSV 186 comprises copper or a copper alloy, and can have sidewalls that are lined with a barrier layer comprising tantalum or titanium for example.

Figure 5:
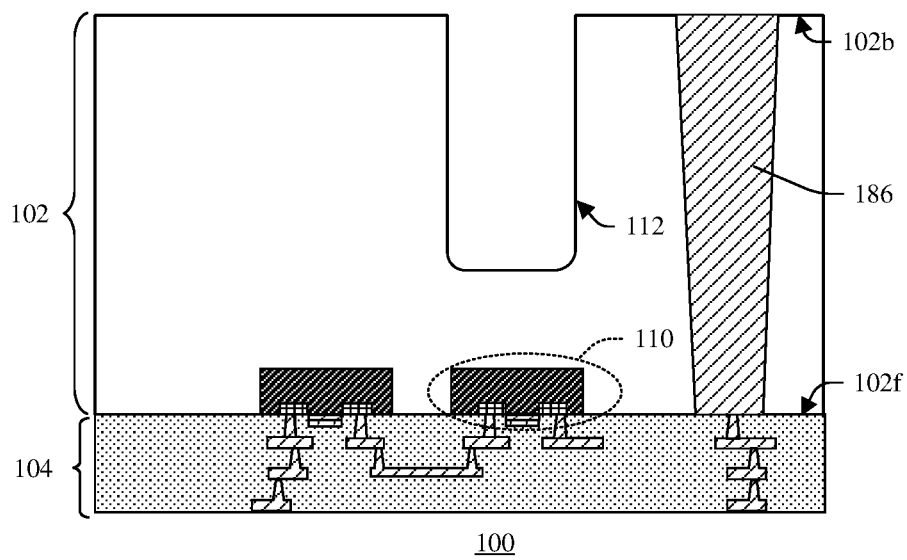

In FIG. 5, a first trench 112 is formed in a backside of the first semiconductor substrate 102. The first trench 112 may be formed by spinning a photoresist solution on the backside of the first semiconductor substrate 102, baking the photoresist, then exposing the photoresist to light through a reticle or photomask, and developing the exposed photoresist to form a patterned mask on the backside of the first substrate. Then, with the patterned mask in place, an etch is carried out. The etch can be a wet etch or dry etch, and if a high aspect ratio trench is desired, a Bosch etching process can be used in some implementations. In other embodiments, extreme ultra-violet (UV) photolithography and/or electron beam lithography techniques could be used to form the first trench 112, among others.

Figure 6:
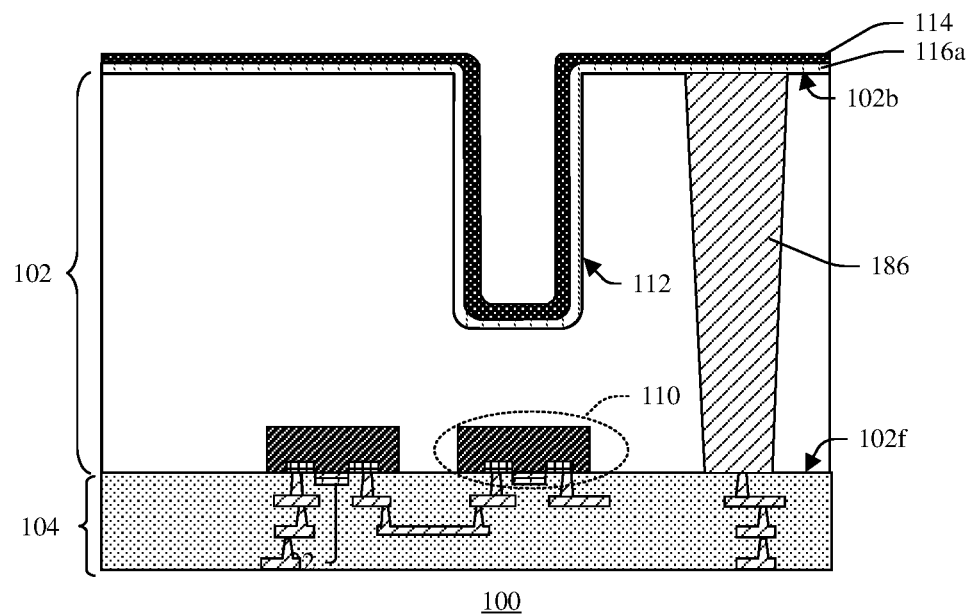

In FIG. 6, a first dielectric layer 116a, such as a high-k dielectric layer is formed over the backside of the first semiconductor substrate 102, including on an innermost surface and sidewalls of the trench 112. The first dielectric layer 116a can be formed by physical vapor deposition (PVD), chemical vapor deposition (CVD), atomic layer deposition (ALD), or thermal oxidation, or others. In some embodiments, the first dielectric layer 116a is a conformal layer. In some embodiments, the first dielectric layer 116a is a high-k dielectric and can comprise hafnium and/or zirconium, and can take the form of hafnium silicate, zirconium silicate, hafnium dioxide and/or zirconium dioxide, among others.

Still referring to FIG. 6, a first conductive layer 114 is then formed over the first dielectric layer 116a. The first conductive layer 114 can correspond to a capacitor electrode, and can comprise a metal or doped polysilicon and can be conformal. For example, metals can include copper, aluminum, tungsten, nickel, titanium, zirconium and/or others; and can be formed by PVD, CVD, ALD, sputtering, or electroplating, among others.

Figure 7:
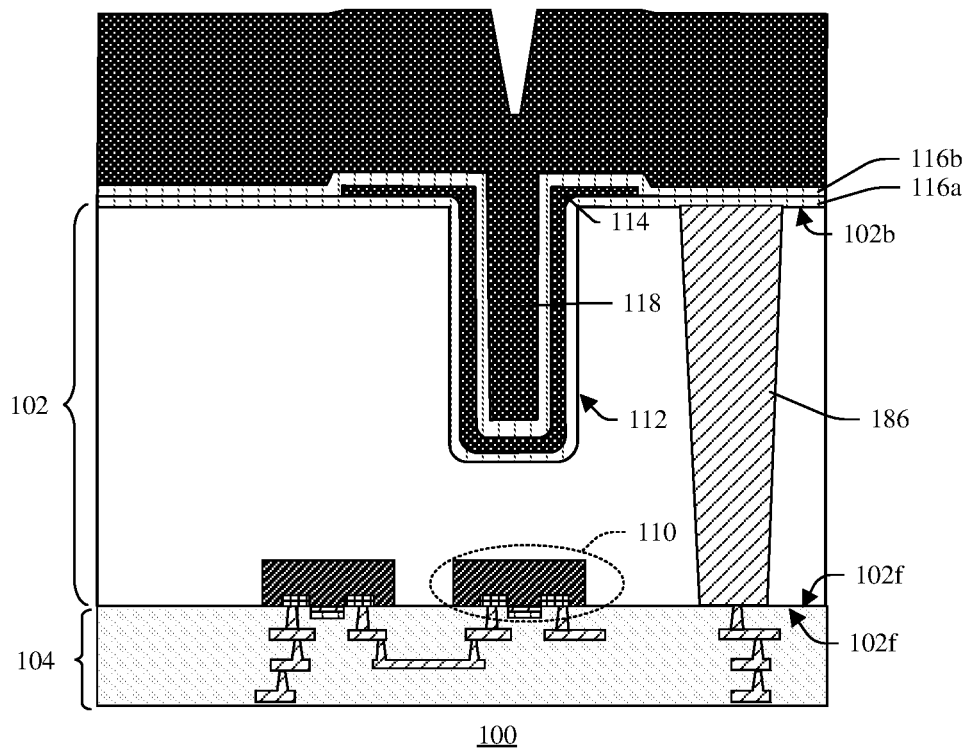

In FIG. 7, the first conducive layer 114 has been patterned, for example, by forming a photomask and then performing an etch with the photomask in place. The photomask is then removed, for example by ashing or plasma stripping, and a second dielectric layer 116b, such as a high-k dielectric layer is formed over an upper surface of the first conductive layer 114 in the trench 112. The second dielectric layer 116b lines an innermost surface and sidewalls of the trench, lines inner sidewalls of the first conductive layer in the trench, and extends over an upper surface of the first conductive layer 114 and first dielectric layer 116a on the backside of the substrate out of the trench. In some embodiments, the second dielectric layer 116b is a conformal layer. The second dielectric layer 116b can be formed by PVD, CVD, ALD, or thermal oxidation, or others. In some embodiments, the second dielectric layer 116b can comprise a high-k dielectric material comprising hafnium and/or zirconium, and can take the form of hafnium silicate, zirconium silicate, hafnium dioxide and/or zirconium dioxide, among others.

Still referring to FIG. 7, a second conductive layer 118 is then formed over the second dielectric layer 116b. The second conductive layer 118 can correspond to a capacitor electrode, and can comprise a metal or doped polysilicon. For example, metals can include copper, aluminum, tungsten, nickel, titanium, zirconium and/or others; and can be formed by PVD, CVD, ALD, sputtering, or electroplating, among others.

Figure 8:
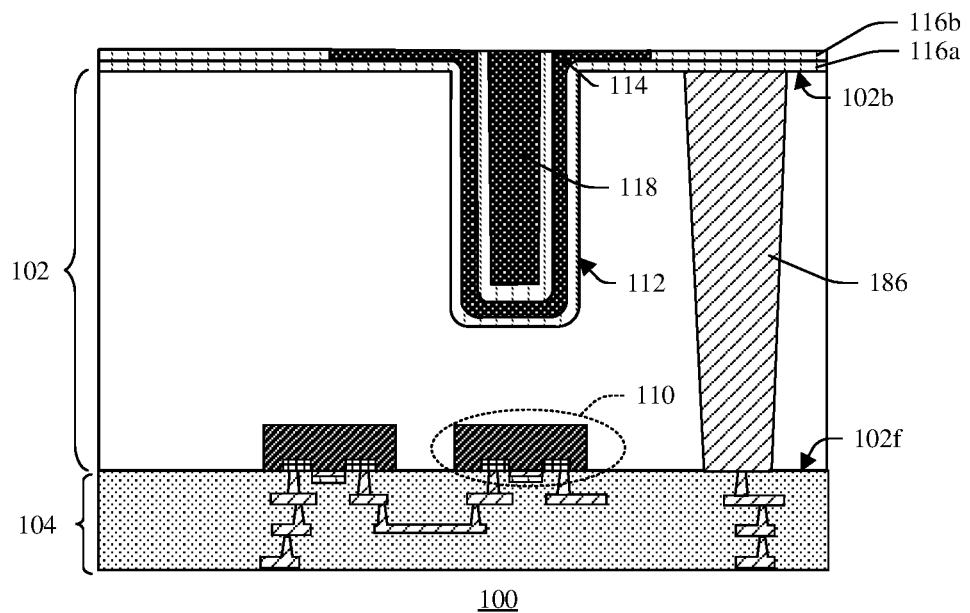

In FIG. 8, a chemical mechanical planarization (CMP) operation is performed. In the illustrated embodiments, the CMP operation planarizes an upper surface of the first conductive layer 114 with an upper surface of the second conductive layer 118. It will be appreciated that in other embodiments, for example where additional capacitor dielectric layers and/or additional conductive layers are present, the CMP operation may stop on one or more of the conductive layers and/or capacitor dielectric layers while leaving other of the these layers at different step heights.

Figure 9:
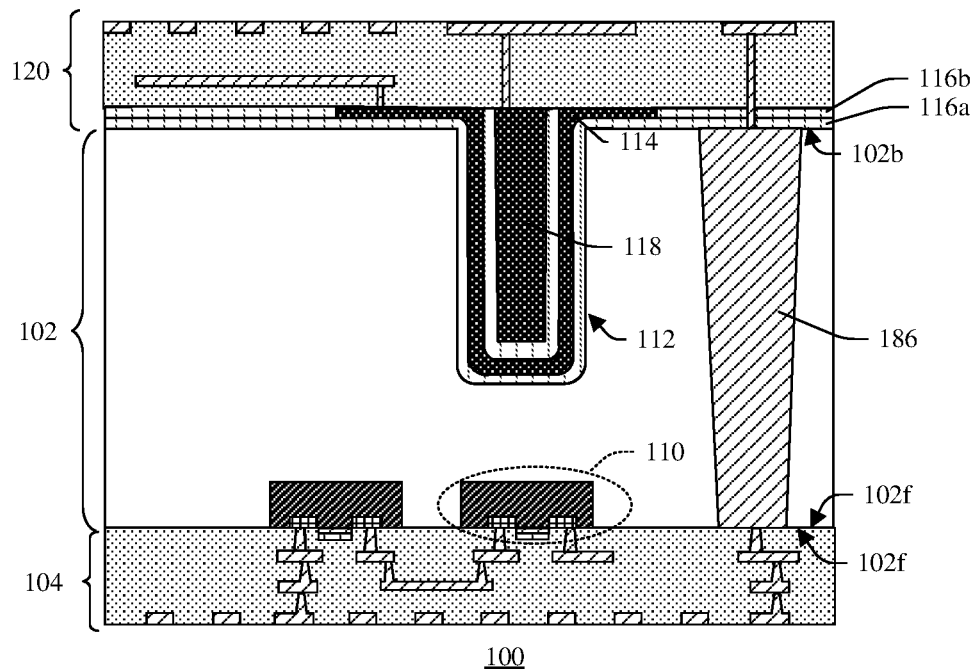

In FIG. 9, a first backside interconnect structure 120 is formed. The first backside interconnect structure 120 can be formed, for example, by forming a first ILD layer over the planarized upper surface of FIG. 8, and then using photolithography to form contact openings in the first ILD layer. Metal, which can comprise tungsten, aluminum, and/or copper for example, can be formed in the contact openings, and can then be planarized to establish contacts. Additional ILD layers can be formed, and then via openings and line openings can be formed and filled with metal, such as copper or copper-aluminum alloy, and then can then be planarized to form metal lines and vias of the first backside interconnect structure.

Figure 10:
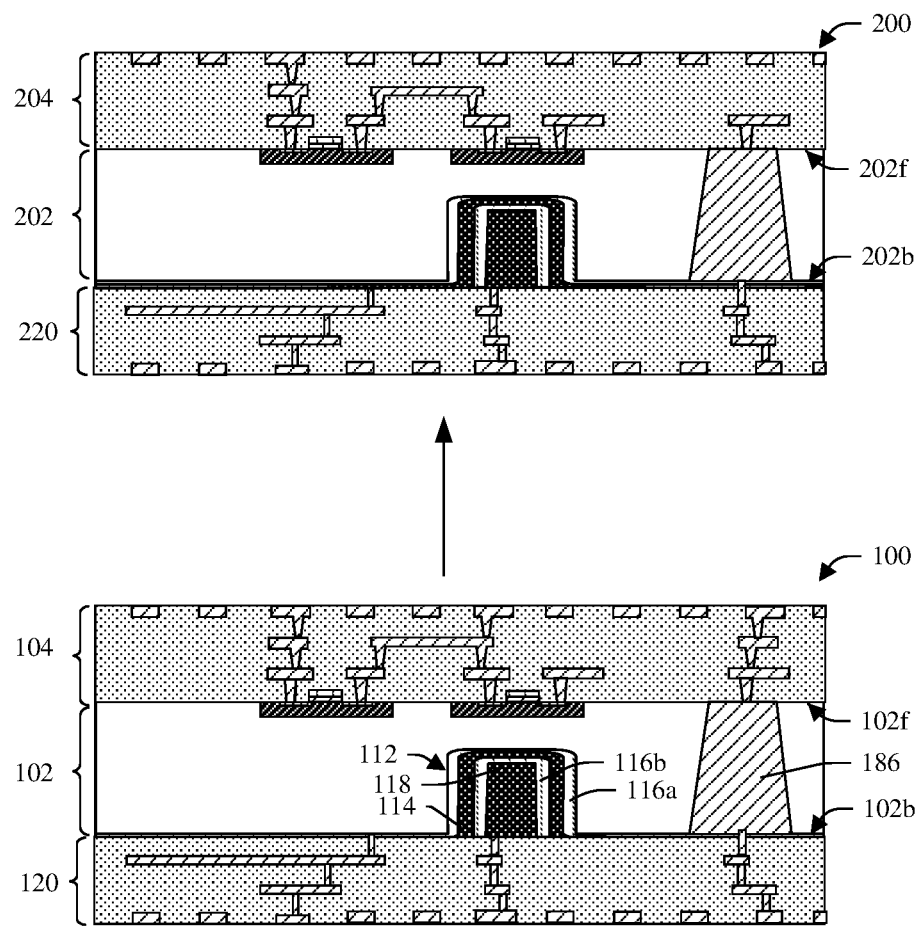

In FIG. 10, the first semiconductor structure 100 (which includes the first semiconductor substrate 102, the first frontside interconnect structure 104 disposed on a frontside of the first semiconductor substrate 102, and the first backside interconnect structure 120 disposed on the backside of the first semiconductor substrate 102) is bonded to a second semiconductor structure 200 (which includes a second semiconductor substrate 202, a second frontside interconnect structure 204 and a second backside interconnect structure 220). The bonding process is a hybrid bonding process, whereby dielectric material of the first semiconductor structure 100 is bonded to dielectric material of the second semiconductor structure 200; and whereby metal of the first semiconductor structure 100 is bonded to metal of the second semiconductor structure 200.

Figure 11:
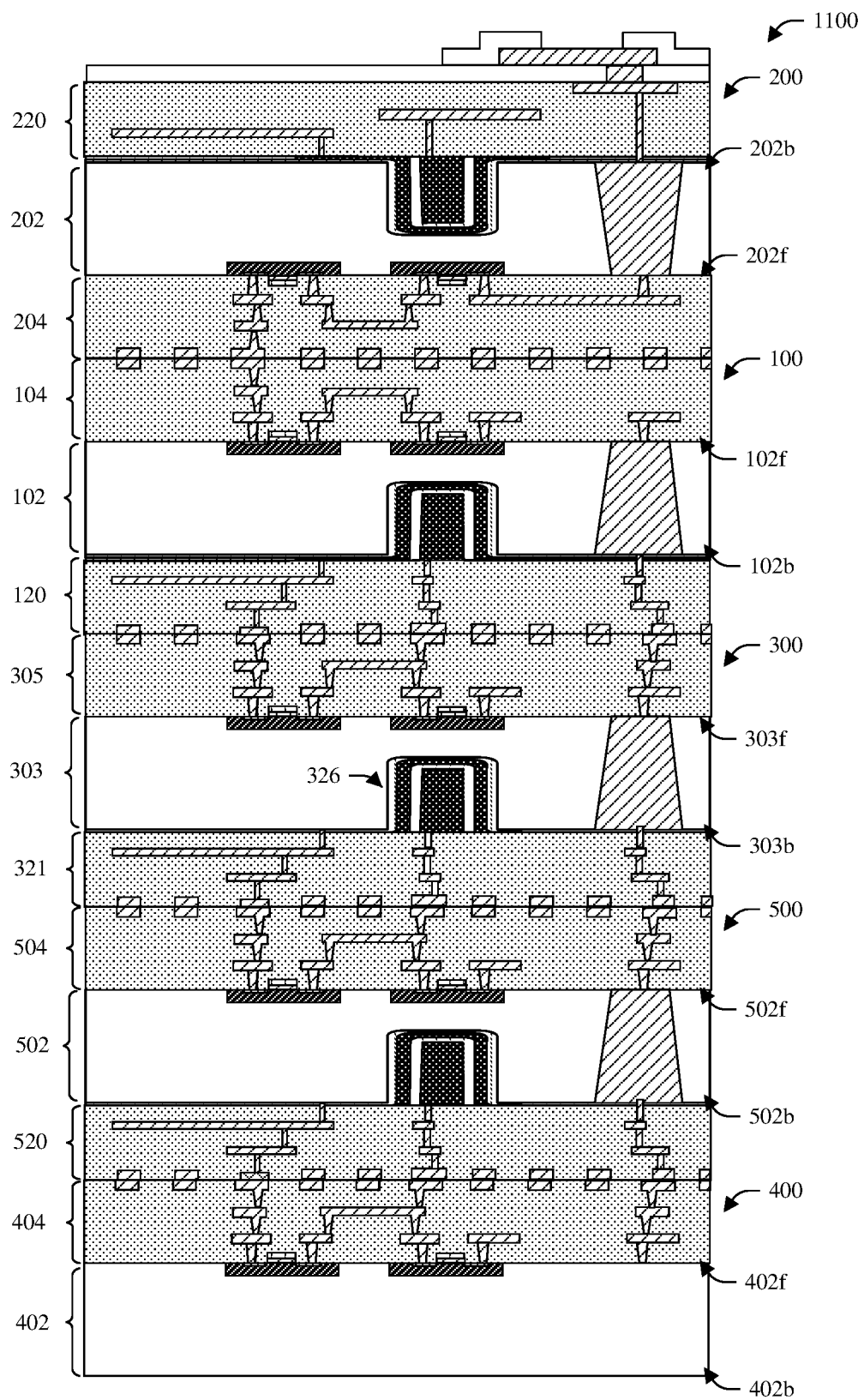

In FIG. 11, additional semiconductor structures, including a third semiconductor structure 300, fourth semiconductor structure 400, and fifth semiconductor structure 500, are bonded together to form a three-dimensional IC 1100. Typically, these additional semiconductor structures are bonded together using a bonding structure, which can include a hybrid bond or can include solder balls, solder bumps, conductive pillars such as copper or copper-alloy pillars, microbumps, or other bonding structures.

For example, a third semiconductor substrate 303 having a third frontside surface 303f and a third backside surface 303b can be bonded to a first backside interconnect structure 120. A third trench 326 is disposed in the third backside surface of the third semiconductor substrate 302. The third trench 326 is filled with a third inner capacitor electrode, a third capacitor dielectric layer overlying the third inner capacitor electrode, and a third outer capacitor electrode overlying the third capacitor dielectric layer. Thus, for example, the capacitor in FIG. 1 and/or FIG. 2 can be inset into the third trench 326 in some embodiments. Thus, after bonding, the third semiconductor substrate 303 is disposed beneath the first semiconductor substrate 102. The first backside interconnect structure 120 and a third frontside interconnect structure 305 are disposed between the first backside surface 102b of the first semiconductor substrate and the third frontside surface 303f of the third semiconductor substrate. The first backside interconnect structure 120 includes a plurality of metal lines and vias that are operably coupled to capacitor electrodes of the first trench capacitor to other conductive features in the 3DIC. The third frontside interconnect structure 305 also includes a plurality of metal lines and vias that operably couple semiconductor devices disposed in or on the third substrate to one another.

A fourth semiconductor substrate 402 having a fourth frontside surface 402f and a fourth backside surface 402b, and a fifth semiconductor substrate 502 having a fifth frontside surface 502f and fifth backside surface 502b can also be bonded as part of the 3DIC 1100. A fourth frontside interconnect structure 404 is present. A fifth frontside interconnect structure 504 and a fifth backside interconnect structure 520 are also present. The fifth frontside interconnect structure 504 is bonded to the third backside interconnect structure 321, and the fifth backside interconnect structure 520 is bonded to the fourth frontside interconnect structure 404.

Figure 12:
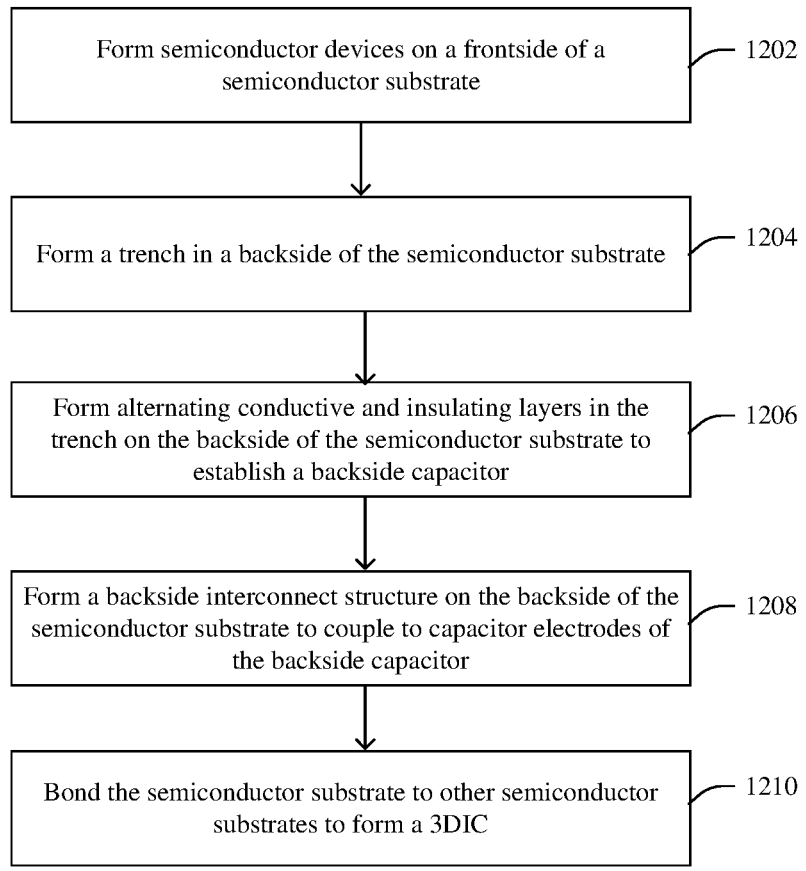
FIG. 12 illustrates a flow chart depicting some embodiments of methods in accordance with the present disclosure.

FIG. 12 shows some embodiments of a method for forming a semiconductor structure in accordance with some aspects of the disclosure. It will be appreciated that the illustrated acts can be performed in different orders in other embodiments, one or more of the illustrated acts may be omitted in some other embodiments, and additional acts that are not illustrated in FIG. 12 may be present in other implementations. Thus, FIG. 12 is merely a non-limiting example.

In 1202, semiconductor devices are formed on a frontside of a semiconductor substrate.

In 1204, a trench is formed in a backside of the semiconductor substrate.

In 1206, alternating conductive and insulating layers are formed in the trench on the backside of the semiconductor substrate to establish a backside capacitor.

In 1208, a backside interconnect structure is formed on the backside of the semiconductor substrate to couple to capacitor electrodes of the backside capacitor.

In 1210, the semiconductor substrate and is optionally bonded to other semiconductor substrates to form a 3DIC.

Thus, some embodiments of the present disclosure relate to a semiconductor structure. The structure includes a semiconductor substrate having a frontside surface and a backside surface. A frontside interconnect structure is disposed over the frontside surface, and includes a plurality of metal lines and vias that operably couple semiconductor devices disposed in or on the frontside surface of the semiconductor substrate to one another. A trench is disposed in the backside surface of the semiconductor substrate. The trench is filled with an inner capacitor electrode in the trench, a capacitor dielectric layer in the trench and overlying the inner capacitor electrode, and an outer capacitor electrode in the trench and overlying the capacitor dielectric layer.

Other embodiments relate to a semiconductor structure. The semiconductor structure includes a first semiconductor substrate having a first frontside surface and a first backside surface. A second semiconductor substrate has a second frontside surface and a second backside surface. The second semiconductor substrate is disposed over the first semiconductor substrate. A first interconnect structure is disposed between the first frontside surface of the first semiconductor substrate and the second frontside surface of the second semiconductor substrate. The first interconnect structure includes a first plurality of metal lines and vias that operably couple first semiconductor devices disposed in or on the first frontside surface of the first semiconductor substrate to one another. A second interconnect structure is disposed between the first interconnect structure and the second frontside surface of the second semiconductor substrate. The second interconnect structure includes a second plurality of metal lines and vias that operably couple second semiconductor devices disposed in or on the second frontside surface of the second semiconductor substrate to one another. A first trench is disposed in the first backside surface of the first semiconductor substrate. The first trench is filled with a first inner capacitor electrode, a first capacitor dielectric layer overlying the first inner capacitor electrode, and a first outer capacitor electrode overlying the first capacitor dielectric layer. A second trench is disposed in the second backside surface of the second semiconductor substrate. The second trench is filled with a second inner capacitor electrode, a second capacitor dielectric layer overlying the second inner capacitor electrode, and a second outer capacitor electrode overlying the second capacitor dielectric layer.

Some other embodiments relate to a method. In the method, semiconductor devices are formed on a frontside of a semiconductor substrate. A trench is formed in a backside of the semiconductor substrate. Conductive and insulating layers are alternatingly formed in the trench on the backside of the semiconductor substrate to establish a backside capacitor. A backside interconnect structure is formed on the backside of the semiconductor substrate to couple to capacitor electrodes of the backside capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a semiconductor substrate having an overall thickness defined between a frontside surface and a backside surface;
    a well region corresponding to a semiconductor device and extending from the frontside surface to a depth into the semiconductor substrate,
    a frontside interconnect structure disposed over the frontside surface, the frontside interconnect structure including a plurality of metal lines and vias that operably couple semiconductor devices disposed in or on the frontside surface of the semiconductor substrate to one another; and
    a trench disposed in the backside surface of the semiconductor substrate, the trench being filled with an inner capacitor electrode in the trench, a capacitor dielectric layer in the trench and overlying the inner capacitor electrode, and an outer capacitor electrode in the trench and overlying the capacitor dielectric layer;
    wherein the semiconductor substrate has a reduced thickness as measured from a bottom surface of the trench to the frontside surface, and the reduced thickness being less than the overall thickness and being less than the depth of the well region.

2. The semiconductor structure of claim 1, wherein the capacitor dielectric layer encapsulates an upper surface, lower surface, and sidewalls of the inner capacitor electrode, and the outer capacitor electrode has a bottom surface and outer sidewalls that make direct contact with the capacitor dielectric layer in the trench.

3. The semiconductor structure of claim 1, further comprising:
    a doped region lining sidewalls of the trench and a bottom surface of the trench.

4. The semiconductor structure of claim 1, further comprising:
    an intermediate capacitor electrode disposed in the trench between the inner capacitor electrode and the outer capacitor electrode.

5. The semiconductor structure of claim 4, wherein at least one of the inner capacitor electrode or the intermediate capacitor electrode have an outermost surface that is nearer to the backside surface of the semiconductor substrate than an upper surface of a metal line in a backside interconnect structure nearest the backside surface of the semiconductor substrate.

6. The semiconductor structure of claim 5, wherein an outermost surface of the outer capacitor electrode is level or planar with the upper surface of the metal line.

7. The semiconductor device of claim 1, wherein the semiconductor substrate includes monocrystalline silicon, and the trench is spaced apart from the well region solely by a portion of the monocrystalline silicon.

8. A semiconductor structure comprising:
    a semiconductor substrate made of monocrystalline silicon that extends continuously and entirely between a frontside surface and a backside surface of the semiconductor substrate;
    a well region extending from the frontside surface into the monocrystalline silicon, and a semiconductor device disposed in or on the well region on the frontside surface of the semiconductor substrate;

a frontside interconnect structure disposed over the frontside surface, the frontside interconnect structure including a plurality of metal lines and vias that are operably coupled to the semiconductor device disposed in or on the frontside surface;

a first capacitor dielectric layer extending from the backside surface into the monocrystalline silicon and spaced apart from the well region solely by a portion of the monocrystalline silicon;

a first capacitor electrode extending into the backside surface of the semiconductor substrate and lining inner sidewalls of the first capacitor dielectric layer and extending over a bottom surface of the first capacitor dielectric layer;

a second capacitor dielectric layer extending into the backside surface of the semiconductor substrate and overlying inner sidewalls of the first capacitor electrode and extending over a bottom surface of the first capacitor electrode; and a second capacitor electrode extending into the backside surface of the semiconductor substrate and overlying inner sidewalls of the second capacitor dielectric layer and extending over a bottom surface of the second capacitor dielectric layer.

9. The semiconductor structure of claim 8, further comprising:

a doped region disposed in the backside surface of the semiconductor substrate, the doped region extending beneath the bottom surface of the first capacitor dielectric layer and extending along outer sidewalls of the first capacitor dielectric layer.

10. The semiconductor structure of claim 8, wherein the first capacitor electrode has a lower portion that extends into the backside surface of the semiconductor substrate and an upper portion that extends over the backside surface of the semiconductor substrate.

11. The semiconductor structure of claim 10, wherein the upper portion extends horizontally over the backside surface of the semiconductor substrate.

12. The semiconductor structure of claim 11, wherein the upper portion of the first capacitor electrode extends to a first height over the backside surface, and wherein the second capacitor electrode has an uppermost surface that extends to a second height over the backside surface, the second height being greater than the first height.

13. The semiconductor structure of claim 8, wherein the second capacitor electrode has a U-shaped cross-section.

14. The semiconductor structure of claim 13, further comprising:

a dielectric material disposed over the backside surface; and a metal interconnect line disposed within the dielectric material;

wherein the dielectric material extends into an inner recess of the U-shaped cross-section of the second capacitor electrode.

15. The semiconductor structure of claim 8:

wherein a thickness of monocrystalline silicon separates the frontside surface of the semiconductor substrate and a nearest point of the first capacitor dielectric layer, the thickness of monocrystalline silicon being measured in a direction perpendicular to the frontside surface of the semiconductor substrate; and wherein the well region extends to a depth as measured in the direction from the backside surface into the monocrystalline silicon, the depth of the well region being less than the thickness of monocrystalline silicon separating the frontside surface of the semiconductor substrate and the nearest point of the first capacitor dielectric layer.

16. A semiconductor structure comprising:

a semiconductor substrate comprising monocrystalline silicon and having a frontside surface and a backside surface;

a well region extending into the frontside surface of the monocrystalline silicon;

a frontside interconnect structure disposed over the frontside surface, the frontside interconnect structure including a plurality of metal lines and vias that operably couple semiconductor devices disposed in or on the frontside surface of the semiconductor substrate to one another;

a first capacitor dielectric layer extending into a recess in the backside surface of the semiconductor substrate and separated from the well region solely by a region of monocrystalline silicon of the semiconductor substrate;

a first capacitor electrode disposed over the first capacitor dielectric layer in the recess, the first capacitor electrode lining inner sidewalls of the first capacitor dielectric layer and extending over a bottom inner surface of the first capacitor dielectric layer;

a second capacitor dielectric layer disposed over the first capacitor electrode in the recess, the second capacitor dielectric layer overlying inner sidewalls of the first capacitor electrode and extending over a bottom inner surface of the first capacitor electrode; and a second capacitor electrode disposed over the second capacitor dielectric layer in the recess, the second capacitor electrode overlying inner sidewalls of the second capacitor dielectric layer and extending over a bottom inner surface of the second capacitor dielectric layer.

17. The semiconductor structure of claim 16, wherein the first capacitor dielectric layer encapsulates an upper surface, the bottom inner surface, and the inner sidewalls of the first capacitor electrode, and the second capacitor electrode has a bottom surface and outer sidewalls that make direct contact with the second capacitor dielectric layer in the recess.

18. The semiconductor structure of claim 16, further comprising:

a doped region lining inner sidewalls of the recess and a bottom surface of the recess.

19. The semiconductor structure of claim 16, further comprising:

a third capacitor electrode disposed in the recess between the first capacitor electrode and the second capacitor electrode.

20. The semiconductor structure of claim 16, wherein the semiconductor substrate has a reduced thickness as measured from a bottom surface of the recess to the frontside surface, and the reduced thickness being less than an overall thickness of the monocrystalline silicon and being less than a depth of the well region.

* * * * *